United States Patent [19]

Mayer et al.

[11] 4,355,892
[45] Oct. 26, 1982

[54] METHOD FOR THE PROJECTION PRINTING

[75] Inventors: Herbert E. Mayer; Ernst W. Loebach, both of Eschen, Liechtenstein

[73] Assignee: Censor Patent- Und Versuchs-Anstalt, Vaduz, Liechtenstein

[21] Appl. No.: 217,787

[22] Filed: Dec. 18, 1980

[51] Int. Cl.³ .......................................... G03B 27/32
[52] U.S. Cl. ..................................................... 355/77
[58] Field of Search ................... 355/67, 77, 132, 133, 355/78, 79

[56] References Cited

U.S. PATENT DOCUMENTS 3,334,543  8/1967  Perner et al. ................ 355/67 X
3,695,758  10/1972  Tanaka ........................ 355/67 X
4,215,935  8/1980  Loebach ........................ 355/67

Primary Examiner—Richard A. Wintercorn
Attorney, Agent, or Firm—Karl F. Ross

[57] ABSTRACT

In a method for the projection printing of masks onto a wafer coated with a photosensitive layer, said mask and said wafer being aligned by imaging alignment patterns of said mask onto said wafer by means of alignment light. In order to obtain a high-intensity and high-contrast alignment signal generated by plotting said alignment light reflected from said wafer, said alignment light comprises at least two narrow wavelength ranges spaced from each other on the wave length scale, in said ranges said photosensitive layer of said workpiece being non-sensitive or low-sensitive, determining the intensity of said alignment light reflected from said workpiece and generating an alignment signal from the wavelength range of said alignment light having highest intensity.

5 Claims, 8 Drawing Figures

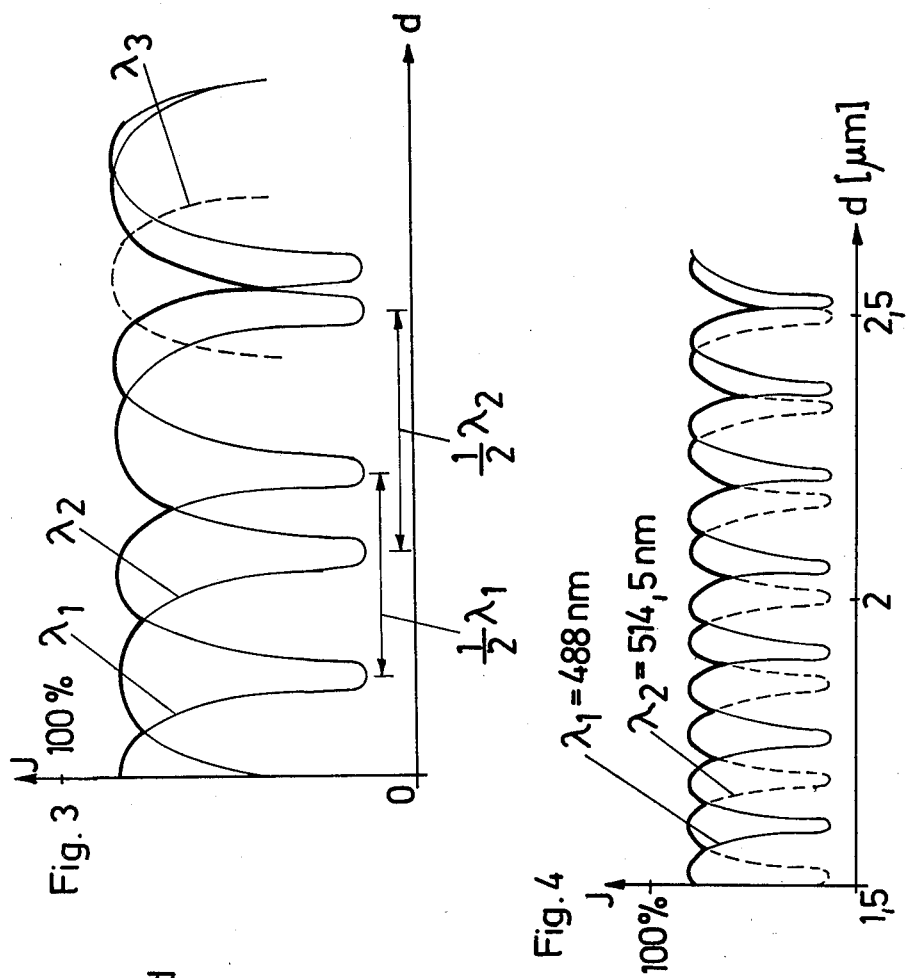
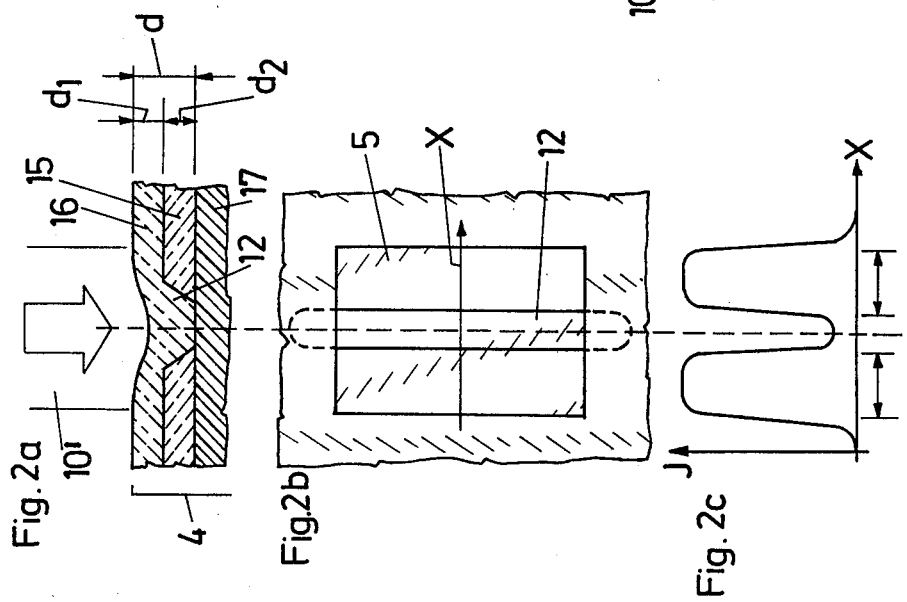

METHOD FOR THE PROJECTION PRINTING

BACKGROUND OF THE INVENTION

1. Field of the Invention

This invention relates to a method for the projection printing of masks onto a workpiece, particularly onto a wafer for the manufacture of integrated circuits.

2. Description of the Prior Art

The manufacture of integrated circuits requires the printing of masks with certain patterns onto a wafer coated with a photosensitive layer. If the wafer already contains circuit elements, mask and substrate have to be aligned to each other prior to the printing process in order to image the mask pattern in a precisely defined region. Alignment patterns are provided on the mask for this alignment process, said alignment patterns having, for example, the shape of transparent windows whereas alignment marks are provided on the wafer. Said alignment marks are, for example, a linear groove in an $SiO_2$-layer of the wafer. Corresponding alignment marks and alignment patterns are imaged into each other by means of alignment light reflected from the workpiece in order to obtain an alignment criterion.

Most visual-manual alignment methods employ polychromatic alignment light as alignment illumination. In such case, the light source is an incandescent lamp or a xenon lamp so that the spectrum of the alignment light ranges from about 500 nm into infrared. Alignment methods employing polychromatic light have, however, a number of disadvantages. The alignment signal should be characterized not only by high intensity but also by high contrast. Hence, the alignment light should be well modulated by the alignment mark on the wafer. An alignment mark on the wafer may be interpreted as sharply defined regions of high and low reflectivity which is dependent on the wavelength, said regions differing from one another in the layer structure of the wafer. When using polychromatic alignment light, the alignment light reflected from the wafer contains non-modulated or low-modulated fractions, thus impairing the contrast.

In view of the above-mentioned reasons and of the fact that the image efficiency of the lenses which are used for alignment is greater, when employing monochromatic light, most automatic alignment methods, employ alignment light having a relatively narrow spectrum. (in the order of magnitude of some nm).

One of these prior art systems uses the exposure light source for the alignment process, which is generally a mercury vapor lamp. Either the narrow spectral range around 547 nm or the spectral range around 436 nm will then be used as alignment light.

There is a further problem arising in this connection. If, for reasons which will be discussed later on, the spectral range around 547 nm is not suitable and the alignment process is carried out by means of alignment light at 436 nm the intensity must be very low. This is due to the fact that the photosensitive layer on the wafer is highly absorbent and sensitive at wavelengths of less than 450 nm. Said photosensitive layer should, however, not be pre-exposed by the alignment light. Moreover, the refraction coefficient n of the layer increases so that a substantial portion of the alignment light at the boundary face air/photosensitive layer is reflected or absorbed in the photosensitive layer. This fact contributes to a deterioration of the alignment signal. The signal noise ratio will be deteriorated, in particular.

It is further known to use a separate alignment light source with a narrow spectrum for the alignment process.

As already mentioned, an alignment signal must be characterized by high intensity and high contrast in order to be highly evaluable. Both values are partly determined by the layer sequence on the wafer which is conditioned by the manufacturing process. The features of the layers on the wafer are comparable to those of optical layers. In spite of the fact that the thickness of the layers are a multiple of the alignment wavelength, disturbing interference phenomena occur because of the great coherency length of the alignment light, i.e. the alignment light reflected from the wafer will often be attenuated to a high degree. This creates an adverse effect on the intensity as well as on the contrast of the alignment signal.

SUMMARY OF THE INVENTION

It is, therefore, the object of the invention to improve a method for the projection printing of masks, particularly onto a wafer, said improvement being defined in that largely independent of the layer sequence on the wafer, a high-intensity and high-contrast alignment signal is provided for aligning mask and wafer relative to each other.

According to the invention this is achieved by providing an alignment light comprising at least two narrow wavelength ranges spaced from each other on the wavelength scale, in said ranges said photosensitive layer of said workpiece being non-sensitive or low-sensitive, determining the intensity of said alignment light reflected from said workpiece and generating an alignment signal from the wavelength range of said alignment light having highest intensity.

This ensures that largely independent of the layer sequence or combination of layer thicknesses on the wafer, an alignment signal will be obtained which is always optimal in respect of intensity and contrast.

BRIEF DESCRIPTION OF THE DRAWING

In the following the invention will be described in greater detail by means of examples and with reference to the figures of the drawing without being limited thereto.

FIG. 2a shows a cross-sectional view of the wafer in the region of an alignment mark, FIG. 2b shows the alignment mark on the wafer and the alignment pattern on the mask imaged into each other, FIG. 2c shows the intensity of the alignment light reflected from the wafer in the direction normal to the linear alignment mark, FIG. 3 shows the intensity of the alignment light reflected from the wafer dependent on the thickness of layers conditioned by the manufacturing process, and FIG. 4 shows the intensity of the alignment light reflected from the wafer, the alignment light comprising tow preferably provided spectral lines spaced from each other.

DESCRIPTION OF THE PREFERRED EMBODIMENT

Figure 1A:
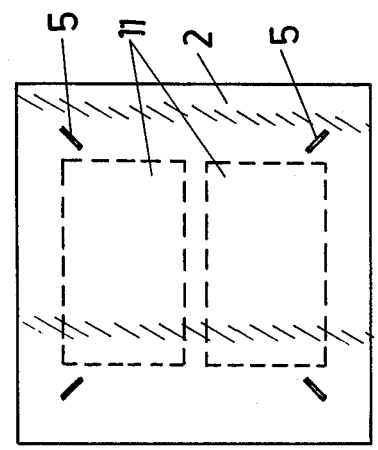
FIG. 1a shows a schematic view of a mask whose pattern is to be imaged onto the wafer.
Figure 1B:
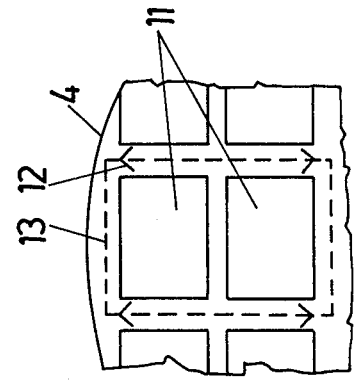
FIG. 1b shows a section from the wafer.
Figure 1:
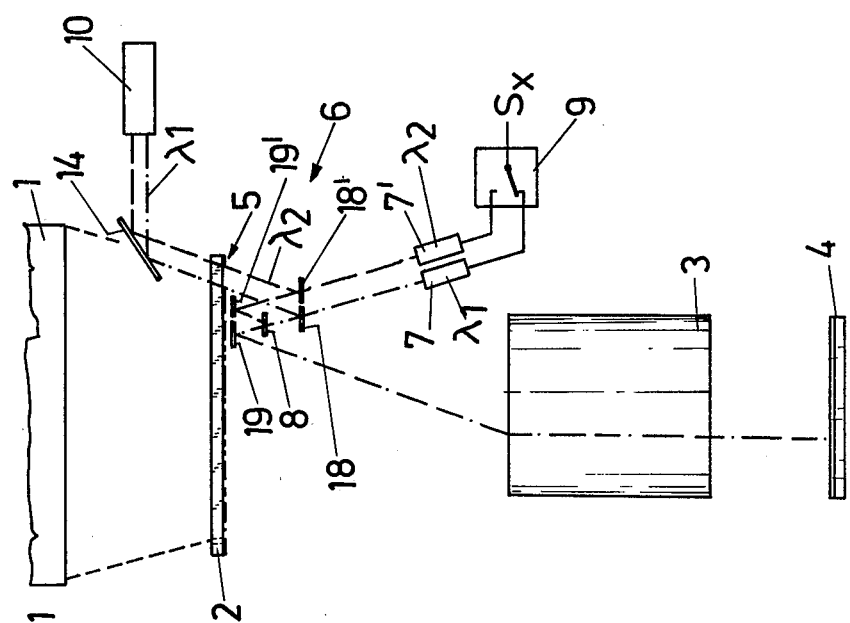
FIG. 1 shows a block diagram of the arrangement according to the invention for the projection printing of masks onto a wafer.

FIG. 1 shows a device for the projection printing of masks onto a wafer comprising an exposure light source 1, the mask 2, the projection lens 3 and the wafer 4. Prior to imaging the mask pattern onto a photosensitive layer of the wafer, mask and wafer have to be aligned relative to each other. As illustrated in FIG. 1a, the mask 2 is provided with alignment patterns 5 arranged outside of the circuit pattern 11, said alignment patterns being rectangular transparent windows. According to FIG. 1b, corresponding linear alignment marks 12 are arranged on the wafer 4 in the projection region 13 of the projection lens 3. The alignment patterns 5 and alignment marks 12 may, obviously, also be arranged within the region provided for the circuit pattern 11.

According to the invention, an alignment light source 10 is provided for the alignment process. Said alignment light source emits alignment light in at least two narrow wavelength ranges spaced from each other, the photosensitive layer on the wafer 4 being non-absorbent in said ranges. As the photosensitive layers which are usually employed at present contain diazo compounds and are, hence, highly absorbent and photosensitive in a wavelength range <450 nm, wavelengths >450 nm are suitable for the alignment illumination.

Accordingly, an argon-ion laser which emits at least the two spectral lines $\lambda_1 = 488$ nm and $\lambda_2 = 514.5$ nm is used as alignment light source 10. The choice of the desired spectral lines is very simple, for example, by adjusting the corresponding resonance conditions. In the arrangement according to FIG. 1 showing the ray path for an associated pair of marks, the two alignment light rays $\lambda_1$ and $\lambda_2$ illuminate by means of a mirror 14 different regions of the window-shaped alignment pattern 5 on the mask 2 and are by means of an auxiliary lens system 6 and the projection lens 3 directed on the corresponding portion of the wafer 4 in which the alignment mark 12 is positioned.

The auxiliary lens system 6 comprises two mirrors 19 and 19', two semi-transparent mirrors 18 and 18' and one interference filter 8. By means of said filter 8, the alignment light reflected from the wafer 4 is partitioned into its alignment light ray of the wavelength $\lambda_1$ and its alignment light ray of the wavelength $\lambda_2$. Said alignment light rays $\lambda_1$ and $\lambda_2$ penetrate the semitransparent mirrors 18 and 18' and image the alignment mark 12 and the alignment pattern 5 into each other on separate photoelectric scanning means 7 and 7'.

Each scanning means 7 produces in a conventional manner an alignment signal, which is proportional to the position of the alignment pattern 5 relative to the alignment mark 12, i.e. indicates the distance of the alignment mark 12 to the rims of the window-shaped alignment pattern 5.

A selecting switch 9 selects the alignment signal $S_x$ of higher intensity and contrast which then serves for aligning the mask 2 and the substrate 4 relative to each other.

FIG. 2a shows a frequent layer structure of the wafer 4 in the region of an alignment mark 12. The wafer 4 comprises a substrate 17 of silicium, an $SiO_2$-layer 15 being arranged on the surface of the substrate. The linear alignment mark 12 is formed by a groove in the $SiO_2$-layer 15. The wafer 4 is fully covered by a photosensitive layer 16 into which the circuit pattern of the mask shall be transferred. As the optical features of the photosensitive layer and of the $SiO_2$-layer 15 are similar the wafer 4 can be defined as a reflecting body 17 covered by a partly reflecting layer of the thickness d. A high-intensity and high-contrast alignment signal can only be obtained if the reflectivity of the layer combination of the thickness d arranged on the wafer 4 adjacent to the alignment mask 12 is sufficient, i.e. if the condition for constructive interference is fulfilled. This condition is $d = j \cdot \lambda/2n$, j being a natural number, $\lambda$ being the vacuum wavelength of the alignment light and n the refractive index of the layer. In other words, the intensity of the alignment light reflected from the wafer will only be sufficient if the layer thickness d is an even-numbered multiple of half of the wavelength of the alignment light.

The alignment light reflected from the wafer will be substantially attenuated if the layer thickness d lies in a range which is characterized by the following formula:

$$d = (2j+1) \cdot \lambda/4n$$

It is obvious that the interference condition for an attenuation of the alignment light reflected from the wafer recurs periodically with the layer thickness (period = $\lambda/2n$). An attenuation of the alignment light reflected from the wafer creates at the same time an undesired reduction of the contrast. In order to eliminate this adverse effect, the invention employs an alignment light with at least two narrow wavelength ranges spaced from each other. As shown in FIG. 3, said two narrow wavelength ranges $\lambda_1$ and $\lambda_2$ can be chosen to make the reflectivity of the layer combination arranged on the wafer a maximum for the second wavelength range $\lambda_2$, when one wavelength range has been attenuated.

As relatively great variations in the thickness of the layer combination on the wafer may cause an overlapping of the minima or maxima of both wavelengths $\lambda_1$ and $\lambda_2$ at greater interspaces the present invention also provides a third wavelength range 3 in the alignment light. When plotting the wavelength range of the highest intensity, optimal values are obtained in respect of the contrast of the alignment signal, in particular, and, accordingly, also in respect of the accuracy of alignment. This is of particular importance, when the alignment process shall not only be carried out in the plane of the wafer 4 or of the mask 2 but also in the direction of the optical axis of the projection lens 3.

An alignment exclusively in direction of the optical axis, i.e. a focusing of the image of the mask on the wafer, is, for example, required in a first step in the manufacture of integrated circuits as the wafer has not yet been provided with circuit patterns and alignment marks.

For generating an alignment signal in Z-direction, i.e. for focusing, the image of the window-shaped alignment pattern 5 on the wafer is scanned. The system will be focused when the image reaches its highest contrast, i.e. when the intensity change in the region of the window rims is a maximum.

FIG. 2 shows the image of the transparent window-shaped alignment pattern 5 and of the linear alignment mark 12 on the photoelectric scanning means 7, an alignment signal, for example, for the coordinate X lying in the plane of the wafer being generated by scanning said image normal to the linear alignment mark. FIG. 2c shows the intensity profile of said image. As already mentioned, an alignment signal in direction of the optical axis can also be obtained from said image by plotting the contrast or the change of intensity.

According to FIG. 4, an argon-ion laser is preferably employed as alignment light source 10, the alignment light at least comprising the spectral lines $\lambda_1 = 488$ nm and $\lambda_2 = 514.5$ nm. It is obvious that a high-contrast alignment signal can be obtained with layer thicknesses of between 1 and 2.5 $\mu$m. As already mentioned, it is essential that not the sum of the intensities of both spectral lines is plotted for obtaining the alignment signal but only the spectral line of higher intensity.

What is claimed is:

1. A method for the projection printing of masks onto a workpiece, particularly onto a wafer for the manufacture of integrated circuits, in which the pattern of said mask is imaged onto a photosensitive layer coating said workpiece by means of an exposure light directed through a projection lens, prior to said projection printing aligning relative to each other said mask and said workpiece, which has already been marked, by imaging into each other corresponding alignment marks of said mask and alignment patterns of said workpiece by means of alignment light reflected from said workpiece, said alignment light comprising at least two narrow wavelength ranges spaced from each other on the wavelength scale, in said ranges said photosensitive layer of said workpiece being non-sensitive or low-sensitive, determining the intensity of said alignment light reflected from said workpiece and generating an alignment signal from the wavelength range of said alignment light having highest intensity.

2. A method according to claim 1, wherein said alignment light comprises three or more narrow wavelength ranges spaced from one another.

3. A method according to claim 1 or 2, wherein said narrow wavelength ranges of said alignment light are greater than 450 nm.

4. A method according to claim 1, wherein an argon-ion laser emits said alignment light comprising at least the spectral lines of 488 nm and 514.5 nm.

5. A method for the projection printing of masks onto a workpiece, particularly onto a wafer for the manufacture of integrated circuits, in which the pattern of said mask is imaged onto a photosensitive layer coating said workpiece by means of an exposure light directed through a projection lens, prior to said projection printing focusing the image of said mask onto said workpiece by imaging alignment marks of said mask onto said workpiece by means of alignment light and by scanning said image, said alignment light comprising at least two narrow wavelength ranges spaced from each other, in said ranges said photosensitive layer of said workpiece being non-sensitive or low-sensitive, determining the intensity of said alignment light reflected from said workpiece and generating an alignment signal from the wavelength range of said alignment light having highest intensity.

* * * * *

Dedication 4,355,892.—*Herbert E. Mayer; Ernst W. Lobach*, both of Eschen, Liechtenstein. METHOD FOR THE PROJECTION PRINTING. Patent dated Oct. 26, 1982. Dedication filed Feb. 20, 1990, by the assignee, Mercotrust Aktiengesellschaft.

Hereby dedicates to the Public the remaining term of said patent.
[ *Official Gazette April 17, 1990* ]